US008637967B2

(12) United States Patent
Menath et al.

(10) Patent No.: US 8,637,967 B2
(45) Date of Patent: Jan. 28, 2014

(54) METHOD FOR FABRICATING A SEMICONDUCTOR CHIP AND SEMICONDUCTOR CHIP

(75) Inventors: Markus Menath, Regensburg (DE); Hermann Wendt, Regensburg (DE); Berthold Schuderer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 12/946,138

(22) Filed: Nov. 15, 2010

(65) Prior Publication Data

US 2012/0119389 A1    May 17, 2012

(51) Int. Cl.
*H01L 23/06*    (2006.01)

(52) U.S. Cl.
USPC .......... 257/684; 257/618; 257/620; 257/685; 257/686; 438/460; 438/462; 438/464

(58) Field of Classification Search
None
See application file for complete search history.

(56) References Cited

U.S. PATENT DOCUMENTS

| 5,972,781 | A | * | 10/1999 | Wegleiter et al. | 438/460 |
| 7,052,975 | B2 | * | 5/2006 | Koizumi | 438/460 |
| 2005/0006725 | A1 | * | 1/2005 | Kurosawa et al. | 257/618 |
| 2009/0023295 | A1 | * | 1/2009 | Arita et al. | 438/710 |

* cited by examiner

*Primary Examiner* — Kyoung Lee
(74) *Attorney, Agent, or Firm* — Slater & Matsil, L.L.P.

(57) ABSTRACT

A method includes structuring a semiconductor substrate to produce a number semiconductor chips. Each of the semiconductor chips includes a first main face and a number of side faces. An indentation is formed at a transition between the first main face and the side faces.

27 Claims, 8 Drawing Sheets

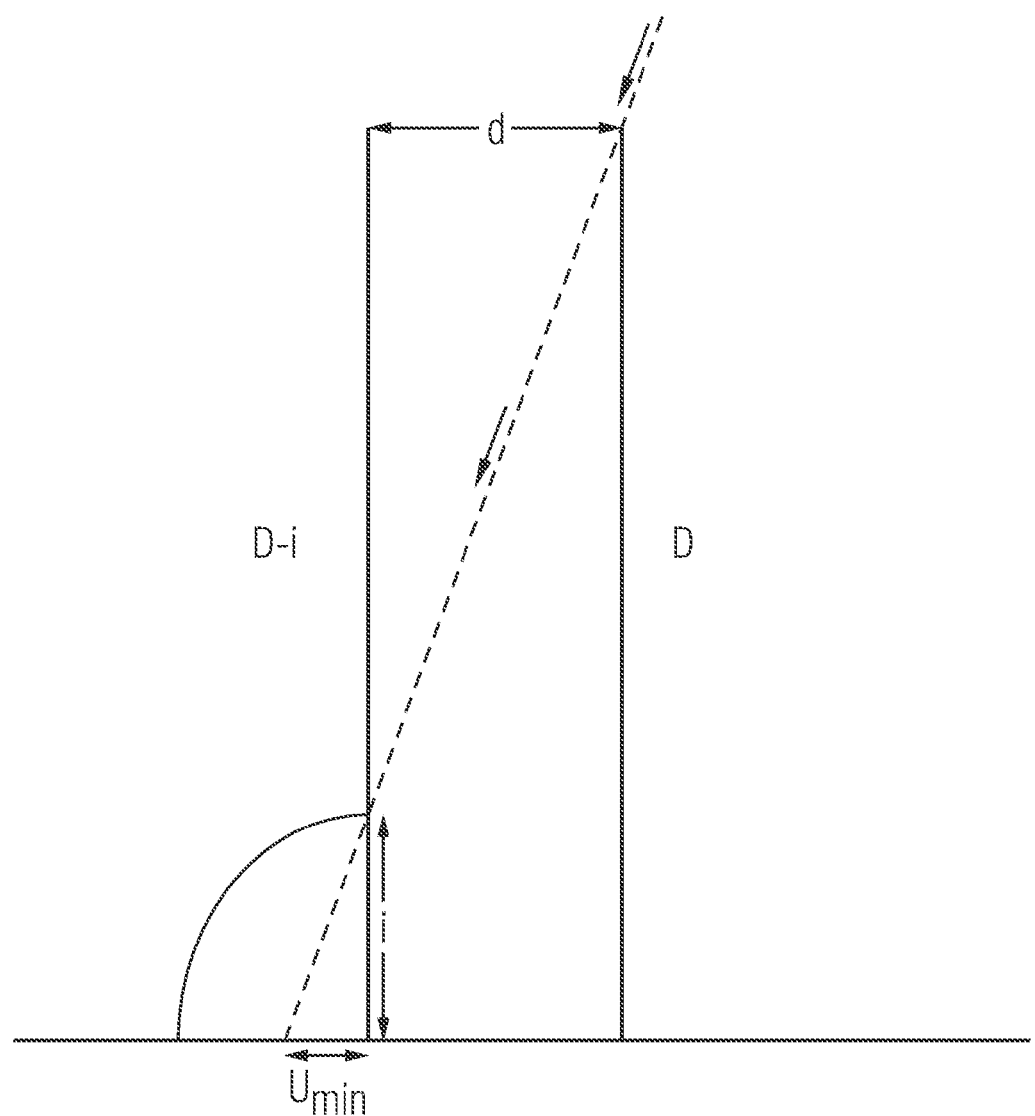

a semiconductor chip and a semiconductor chip according to the independent claims.

SUMMARY

After fabricating electronic devices and circuits on a semiconductor substrate, the substrate will be singulated into a plurality of individual semiconductor chips. The singulation is normally carried out by sawing which is a serial process that is time-consuming and expensive. Moreover the saw blade must have a certain minimum rigidity so that it can not be formed arbitrarily thin. Therefore, the minimum width of the saw blade always means a certain waste of semiconductor material, which can add up to a significant portion of the area of the semiconductor substrate. For that reason, research and investigations have been conducted in the semiconductor industry in the past on whether alternative processes besides sawing exist and fulfill the requirements for a practicable application. One of these alternatives is etching which has the advantage of parallel processing and a reduction of waste of semiconductor material by a reduction of the width of the cutting or separating lines. Moreover, in many cases semiconductor chips are fabricated which have electrical contact pads not only on one of their main faces but on both of them and it may happen that a metallization has to be applied onto essentially the entire area of one of the main faces.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3, show schematic cross-sectional side view representations to illustrate a method for fabricating a semiconductor chip according to a further embodiment of the method as illustrated in one of FIG. 1 or 2.

FIG. 4 shows a schematic cross-sectional side view representation of a groove and an indentation for illustrating the geometric conditions;

DETAILED DESCRIPTION OF ILLUSTRATIVE EMBODIMENTS

Figure 1:
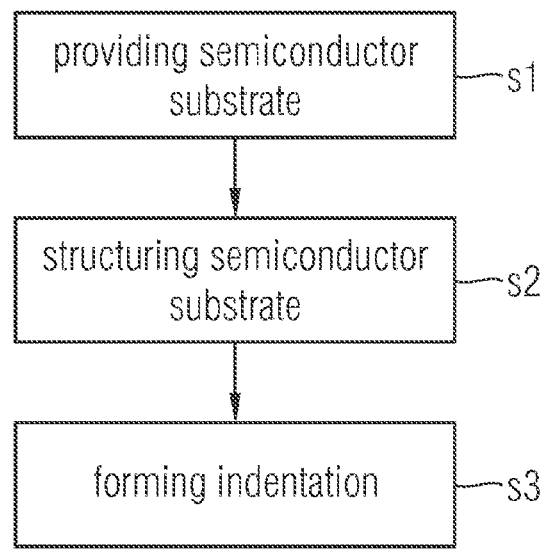
FIG. 1 shows a flow diagram of a method for fabricating a semiconductor chip according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method for fabricating a semiconductor chip and a semiconductor chip may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole such as, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e. flat contact layers on an outer surface of the semiconductor package. The contact elements or contact pads may be made from any electrically conducting material, e.g. from a metal such as aluminum, gold, or copper, for example, or a metal alloy, or an electrically conducting organic material, or an electrically conducting semiconductor material.

In the claims and in the following description different embodiments of a method for fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Referring to FIG. 1, there is shown a flow diagram of a method for fabricating a semiconductor chip according to an embodiment. The method comprises providing a semiconductor substrate (s1), structuring the semiconductor substrate to produce multiple semiconductor chips so that each one of them comprises a first main face and a plurality of side faces (s2), and forming an indentation at a transition between the first main face and the side faces (s3).

An advantage of the method as illustrated in FIG. 1 is that problems can be avoided that would otherwise occur if in a certain stage of process a metal layer is deposited onto the entire back surface. If no indentation is provided, the metal layer will be deposited not only on the back surfaces of the semiconductor chips but also on the entire side walls of the chips and on the areas between adjacent chips so that a mechanical connection is fabricated by the deposited contiguous metal layer and a subsequent separation of this connection may lead to metal layer portions deformed in an undefined way or even delaminated. On the other hand by providing an indentation no problems will occur with the subsequent deposition of a metal layer as the metal layer can not be deposited on the shadowed surface area of the indentation so that the metal layer will not be deposited as a contiguous layer mechanically connecting adjacent semiconductor chips. This will be demonstrated in greater detail further below.

According to an embodiment of the method of FIG. 1, the semiconductor substrate is comprised of a semiconductor wafer. The semiconductor substrate, however, can otherwise be of any arbitrary and desired size and shape.

According to an embodiment of the method of FIG. 1, the indentation is formed concave, i.e., comprises an inward curvature.

According to an embodiment of the method of FIG. 1, the indentation is formed circumferentially so that it is provided at each circumferential position of the transition between the main face and the side faces. In case of a rectangular main face there are four side faces so that the indentation is formed as a rectangular circumferential indentation.

According to an embodiment of the method of FIG. 1, the indentation is formed so that it comprises a curved surface.

According to an embodiment of the method of FIG. 1, the indentation is formed by an etching step, in particular by an isotropic etching step.

According to an embodiment of the method of FIG. 1, structuring of the semiconductor substrate is conducted by an etching step, in particular by an anisotropic etching step.

According to an embodiment of FIG. 1, structuring of the semiconductor substrate is conducted before forming the indentation.

According to an embodiment of the method of FIG. 1, structuring of the semiconductor substrate is conducted after forming the indentation.

According to an embodiment of the method of FIG. 1, each one of the semiconductor chips comprises a second main face opposite to the first main face, and a metal layer is deposited onto the second main face. The metal layer may serve the function of an electrical contact layer for an electrical device contained in the semiconductor chip.

According to an embodiment of the method of FIG. 1, the semiconductor substrate is ground at its backside surface in order to reduce its thickness. That means according to this embodiment the semiconductor substrate is ground before structuring it into a plurality of semiconductor chips.

According to an embodiment of the method of FIG. 1, the semiconductor chips themselves are ground in order to reduce their thickness. That means, according to this embodiment, the semiconductor chips are ground after the semiconductor substrate has been structured into a plurality of semiconductor chips.

Figure 2:
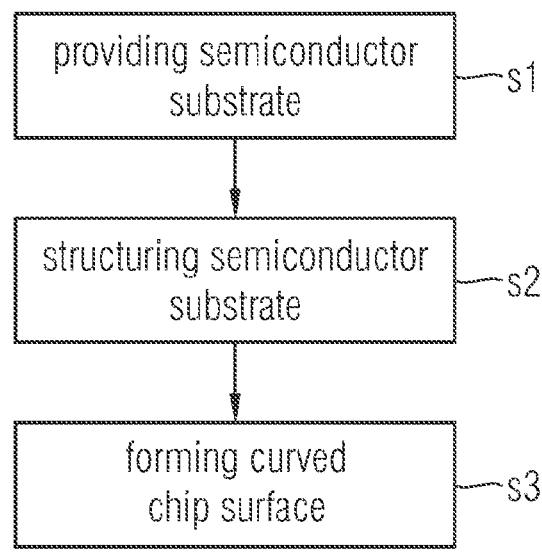
FIG. 2 shows a flow diagram of a method for fabricating a semiconductor chip according to an embodiment.

Referring to FIG. 2, there is shown a flow diagram to illustrate a method for fabricating a semiconductor chip according to an embodiment. The method comprises providing a semiconductor substrate (s1), structuring the semiconductor substrate to produce multiple semiconductor chips so that each one of them comprises a first main face and a plurality of side faces (s2), and forming a curved chip surface connected between the first main face and the side faces of the semiconductor chip (s3).

According to an embodiment of the method of FIG. 2, the curved chip surface is formed by forming an indentation at a transition between the first main face and the side faces of the semiconductor chip.

According to an embodiment of the method of FIG. 2, the curved chip surface is formed concave.

Further embodiments of the method of FIG. 2 can be constructed along the lines of the embodiments of the method of FIG. 1 as described above or with features of those embodiments.

Figure 3A:
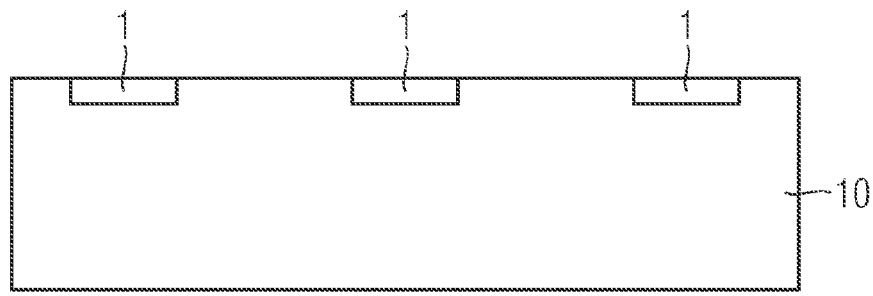
FIG. 3A-3C, collectively
Figure 3B:
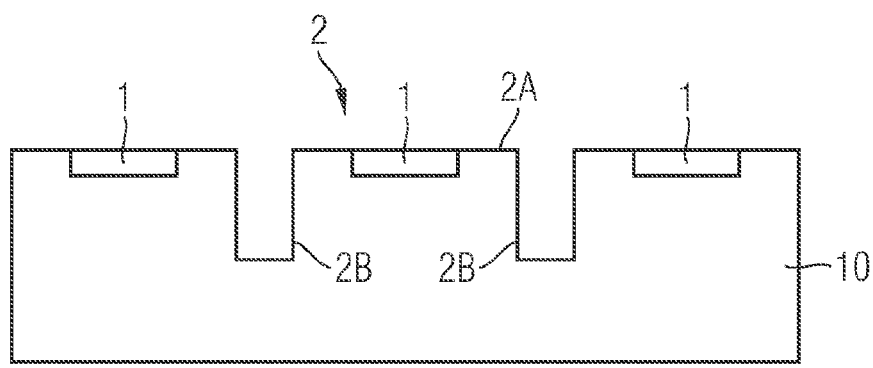
Figure 3C:
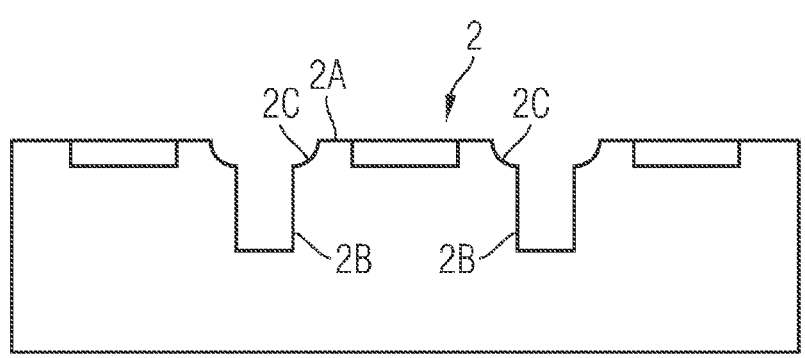

Referring to FIG. 3A-3C, there are shown cross-sectional side view representations to illustrate an embodiment of the method for fabricating a semiconductor chip of FIG. 1 or 2. FIG. 3A shows a cross-sectional side view representation of a semiconductor substrate 10 which comprises a plurality of semiconductor dies 1, i.e. integrated electronic devices or circuits, as they were fabricated in a previous procedure by conventional known methods. The semiconductor dies 1 can be identical with each other or different from each other. The semiconductor substrate 10, for example, can be comprised of a semiconductor wafer. FIG. 3B shows the semiconductor substrate 10 after structuring it to produce multiple semiconductor chips 2. The structuring is performed by forming a plurality of grooves so that each semiconductor chip 2 is surrounded by grooves. The result of the structuring step is that each one of the semiconductor chip 2 comprises a first main face 2A and a plurality of side faces 2B. FIG. 3C shows the semiconductor substrate 10 after forming of an indentation 2C at a transition between the first main face 2A and the side faces 2B of each semiconductor chip 2. The indentation 2C is formed circumferentially so that it is provided at each circumferential position of the transition between the main face 2A and the side faces 2B of each semiconductor chip 2. The semiconductor chips 2 may at this stage be still mechanically connected with each other by contiguous lower portions of the semiconductor substrate 10 and may be finally singulated in a later step which will be shown in further embodiments below.

Referring to FIG. 4, there is shown a cross-sectional side view representation to illustrate the geometric conditions. It will be shown that a formula for the minimum lateral depth $U_{min}$ of the indentation can be derived therefrom. There is depicted a groove having a depth D and a width d and a lateral indentation on the lower-most part of the groove, the indentation having a vertical extension i. A process of depositing a metal layer is indicated by the dashed line and arrows thereupon. The dashed line shows a beam of metal particles which is incident with a maximum possible inclined angle to allow metal particles to enter the region of indentation. The aim is now to derive a minimum lateral depth $U_{min}$ of the indentation so that metal particles will not impinge on any part of the curved surface of the indentation. The following geometric formulas can be determined:

$$U_{min}/d = i/(D-i) \qquad (1)$$

This follows from the second theorem on intersecting lines. Since i<<D, it follows:

$$U_{min}/d = i/D \qquad (2)$$

With the aspect ratio AR=D/d it follows:

$$AR = U_{min} \qquad (3)$$

So that one can derive:

$$U_{min} = i/AR \qquad (4)$$

This formula (4) determines the minimum lateral depth $U_{min}$ of the indentation. In order to be on the safe side, it is preferable to choose a lateral depth U of the indentation which is at least $2 \times U_{min}$.

Referring to FIG. 5A-5H, there are shown cross-sectional side view representations to illustrate a method for fabricating a semiconductor chip according to an embodiment. A method according to this embodiment can also be called "Dicing Before Grinding".

Figure 5A:
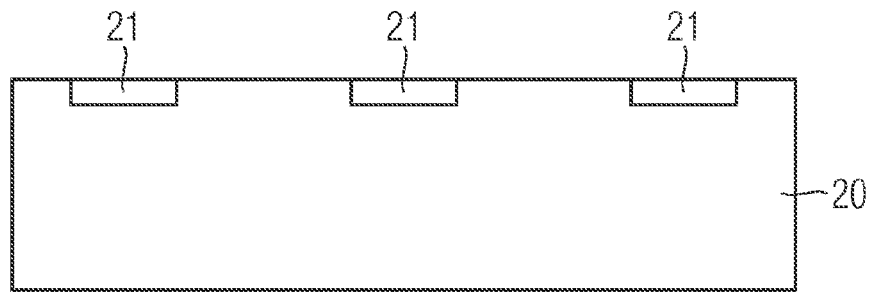
FIGS. 5A-5H show schematic cross-sectional side view representations to illustrate a method for fabricating a semiconductor chip according to an embodiment.

FIG. 5A shows a semiconductor substrate 20 comprising a plurality of semiconductor dies 21, wherein the semiconductor dies 21 are comprised of integrated electronic devices or circuits as fabricated in a previous procedure by conventional known methods. The semiconductor dies 21 can be identical with each other or different from each other. The semiconductor substrate 20, for example, can be comprised of a semiconductor wafer. The semiconductor dies 21 can be located within an active layer near to a main surface of the semiconductor substrate 20.

Figure 5B:
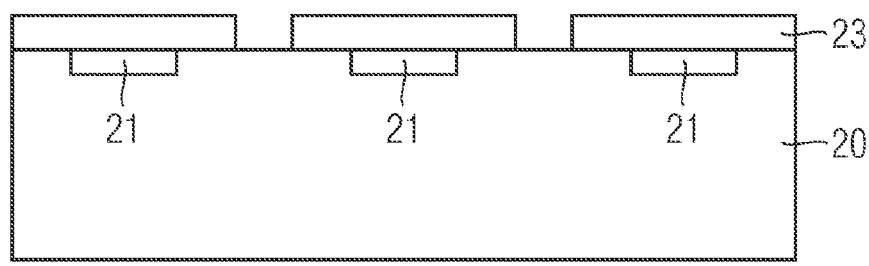

FIG. 5B shows the semiconductor substrate 20 after applying a mask layer 23 onto the main face of the semiconductor substrate 20. The mask layer 23 can, for example, be fabricated of a photoresist material. The mask layer 23 is used for the subsequent etching process and its purpose is to mask those areas which are not to be etched. The material of the mask layer 23 will be selected in accordance with the type and nature of the subsequent etching method. In case of the etching method as used in this embodiment, it will be sufficient to employ a photoresist material for the mask layer 23. If alternative etching methods would be employed, the mask layer 23 would have to be fabricated in a different way like, for example, as a hard mask layer made of other materials than photoresist materials. The mask layer 23 is furthermore formed such that its openings define the lines at which the semiconductor chips are to be separated from each other. The lateral width of the openings is preferably in a range from 5 µm to 100 µm. The openings of the mask layer 23 are configured as a contiguous grid so that each semiconductor die 21 is surrounded by 4 grooves at its 4 side edges.

Figure 5C:
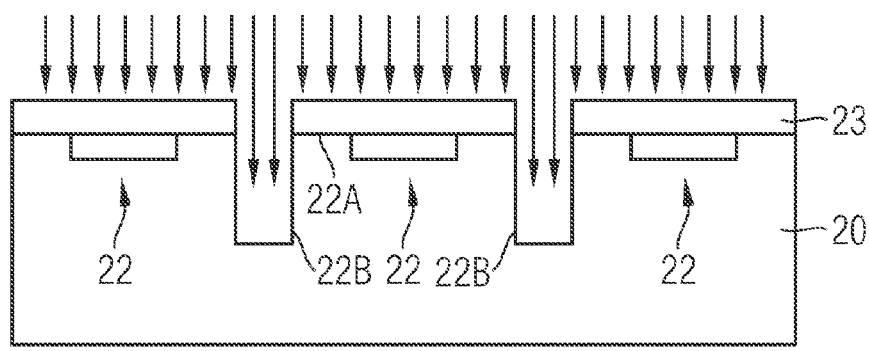

FIG. 5C shows the semiconductor substrate 20 after structuring the semiconductor substrate 20 to produce multiple semiconductor chips 22 so that each one of them comprises a first main face 22A and a plurality of side faces 22B. The structuring is carried out by an anisotropic plasma etching through the openings of the mask layer 23 as indicated by the uni-directional arrows in FIG. 5C. The etching method can be Deep Reactive Ion Etching (DRIE) which has been originally developed by Robert Bosch GmbH and which has been improved later on under the name Advanced Silicon Etching (ASE). This etching method is known to be comprised of a two step dry etching process in which an etching step and a passivating step alternately follow one after the other. For the etching step, for example, $SF_6$ can be used within a carrier gas like, for example, argon by generating a high frequency plasma. For the passivating step a mixture of $C_4F_8$ and argon as carrier gas can be used. In the passivating step a passivation layer of a polymer material is formed on the bottom and vertical side walls of the etched groove. With this etching method aspect ratios of up to 50:1 can be achieved so that in principle groove depths of a few 100 µm can be achieved. For the purpose of the present embodiment a groove depth in the range between 50 µm to 200 µm is preferable.

Figure 5D:
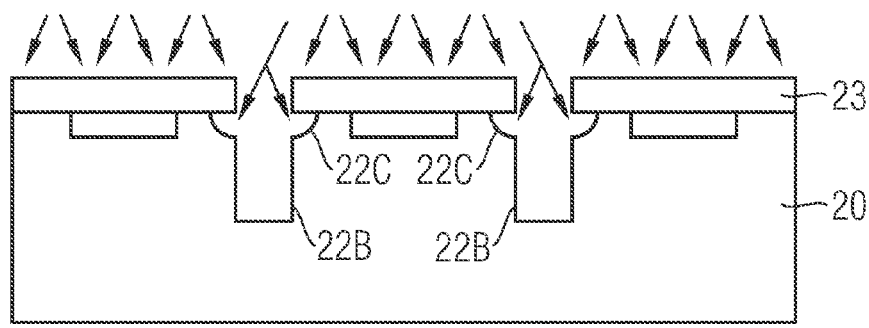

FIG. 5D shows the semiconductor substrate 20 after forming an indentation 22C at a transition between the first main face 22A and the side faces 22B of the semiconductor chips 22. The indentation 22C is formed with a concave structure by employing an additional isotropic etching step which leads to a significant widening of the groove under respective portions of the mask layer 23. For this etching step media can be employed which tend to spontaneous etching without applying a bias voltage at the semiconductor substrate 20. For example, etching media like $SF_6$ or $NF_3$ can be used. As shown by the multi-directional arrows in FIG. 5D, the etching occurs along ambiguous directions and can be carried out as long as the indentation reaches a depth in a lateral direction of at least as that determined by the above formula (4).

It should be noted that the anisotropic etching step of FIG. 5C and the isotropic etching step of FIG. 5D can also be timely interchanged so that at first the isotropic etching will be conducted through the openings of the mask layer 23 to generate the shallow trench extending under the adjacent layer portions of the mask layer 23 and afterwards the anisotropic etching step will be carried out through the openings of the mask layer 23 in order to generate the deep groove vertically under the openings of the mask layer 23.

Figure 5E:
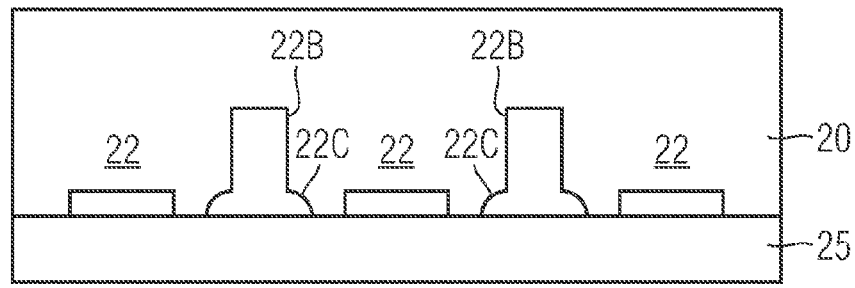

FIG. 5E shows the semiconductor substrate 20 after removing of the mask layer 23 and attaching the semiconductor substrate 20 upside down onto a carrier 25.

Figure 5F:
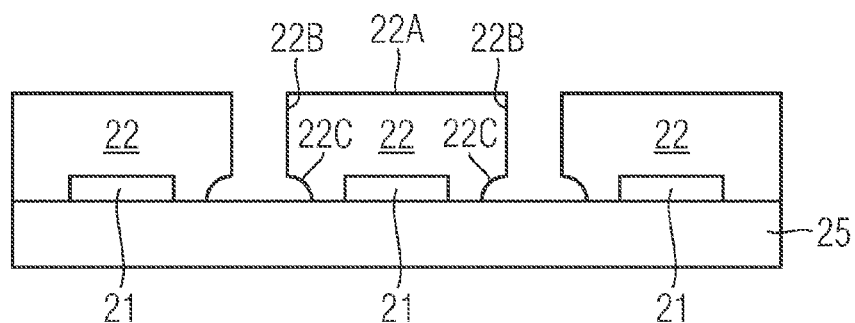

FIG. 5F shows the semiconductor substrate 20 after grinding the semiconductor substrate 20 from the backside until the etched grooves are reached. The grinding step, for example, can be carried out by conventional wafer grinding or by Chemical Mechanical Polishing (CMP).

Figure 5G:
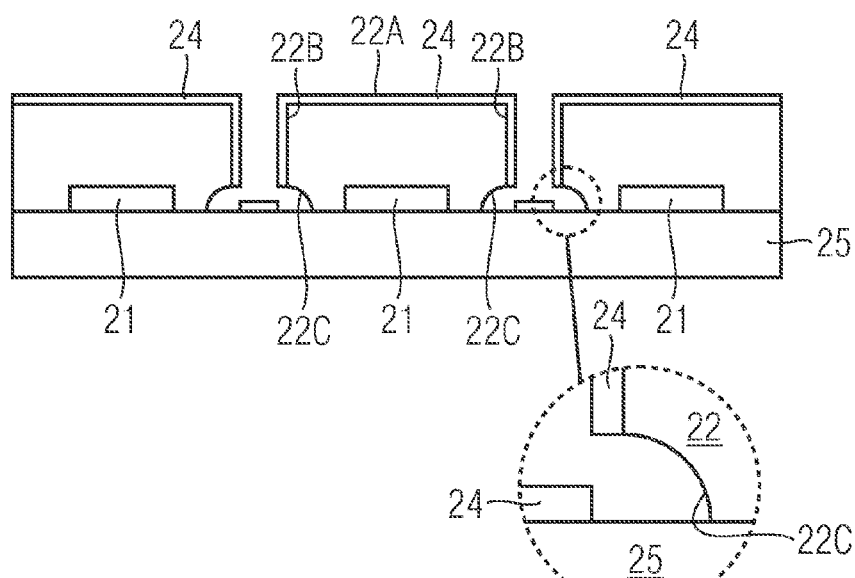

FIG. 5G shows the semiconductor substrate 20 after deposition of a metal layer 24 onto the entire area of the semiconductor substrate. The deposition of the metal layer 24 is carried out preferably at room temperature for preventing surface diffusion of the metal. The deposition of the metal layer 24 can, for example, be carried out, for example, by physical vapor deposition (PVD), evaporation or sputtering or any other directional deposition process. It can clearly be seen in the enlarged circular section that the metal layer 24 will not be deposited onto the curved surfaces within the indentations 22C. Therefore the indentation 22C effectively leads to a demolition of the metal layer 24 at the end of the side face 22B. The metal layer 24 will only be deposited onto the plane surface of the carrier 25 between adjacent semiconductor chips 22 which is of no problem for the further process.

Figure 5H:
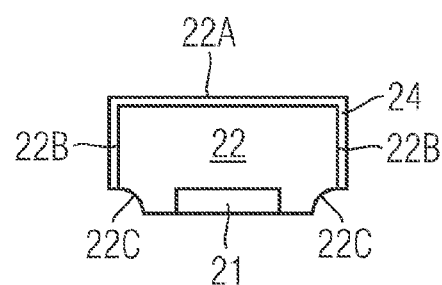

FIG. 5H shows a single semiconductor chip obtained after taking off from the carrier 25.

Referring to FIGS. 6A-6H, there are shown schematic cross-sectional side view representations to illustrate a method for fabricating a semiconductor chip according to an embodiment. A method according to this embodiment can also be called "Grinding before Dicing".

Figure 6A:
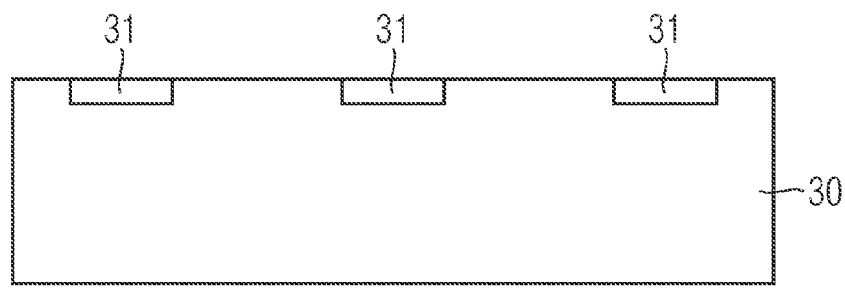
FIGS. 6A-6H show schematic cross-sectional side view representations to illustrate a method for fabricating a semiconductor chip according to an embodiment.

FIG. 6A shows a semiconductor substrate 30 comprising a plurality of semiconductor dies 31 similar or equal to the semiconductor substrate 20 of FIG. 5A.

Figure 6B:
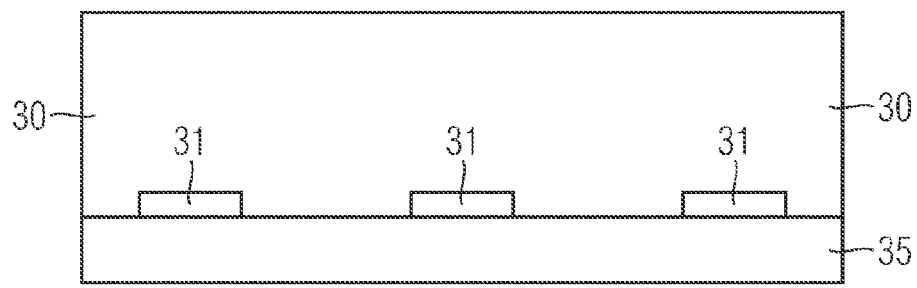

FIG. 6B shows the semiconductor substrate 30 after attaching it upside down to a carrier 35.

Figure 6C:
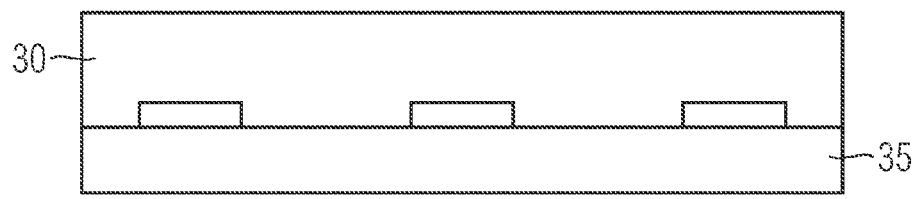

FIG. 6C shows the semiconductor substrate 30 mounted on the carrier 35 after grinding the semiconductor substrate 30 from the backside down to a thickness of the semiconductor substrate 30 which corresponds to the desired thickness of the semiconductor chips to be produced.

Figure 6D:
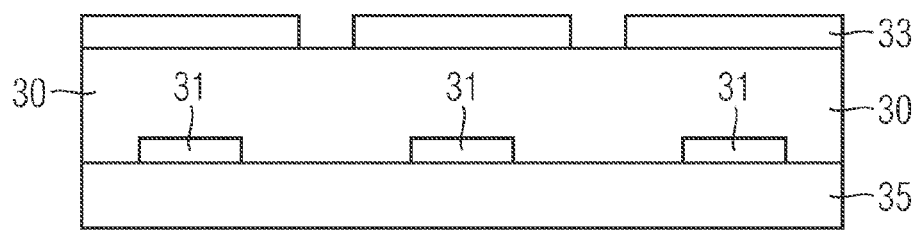

FIG. 6D shows the semiconductor substrate 30 after depositing a mask layer 33 onto the back surface of the semiconductor substrate 30. The grinding step can be carried out, for example, by conventional wafer grinding or by Chemical Mechanical Polishing (CMP).

Figure 6E:
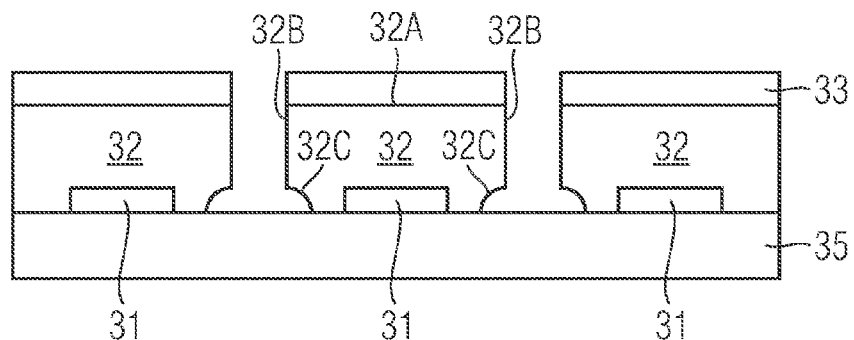

FIG. 6E shows the semiconductor substrate 30 mounted onto the carrier 35 after structuring the semiconductor substrate 30 to produce multiple semiconductor chips 32 so that each one of them comprises a first main face 32A and a plurality of side faces 32B, and after forming an indentation 32C at a transition between the first main face 32A and the side faces 32B of the semiconductor chip 32. Both the structuring step as well as the forming step are again carried out by etching. However, in this embodiment the structuring step must be performed first and thereafter follows the forming step. The forming step can immediately follow after the structuring step and it can be carried out by continuing the etching but altering the etching parameters. At first anisotropic etching is carried out through the openings of the mask layer 33 wherein the same etching media can be used as described in connection with FIG. 5C of the previous embodiment. The anisotropic etching is carried out down to a depth at which the indentation 32C is to be formed. At this stage the etching parameters are changed in a way that the polymer layer, which is alternately generated as a passivation layer at the side walls, is not generated as usual but in a way that it becomes increasingly thin in the depth direction so that it is practically not existent in the lowermost section of the groove. As a consequence of the practically non-existing side wall passivation layer the etching is essentially isotropic so that in the lower most section of the groove a lateral widening occurs as well as a further etching in the depth direction. In this way indentations 32C into the adjacent semiconductor chips 32 are produced as shown in FIG. 6E.

Figure 6F:
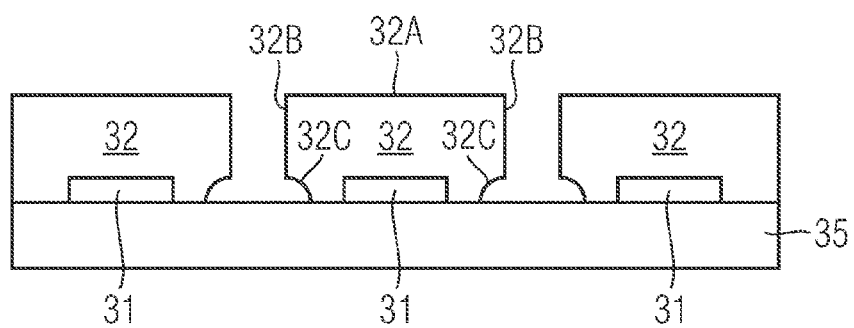

FIG. 6F shows the semiconductor chips 32 after removing of the mask layer 33.

Figure 6G:
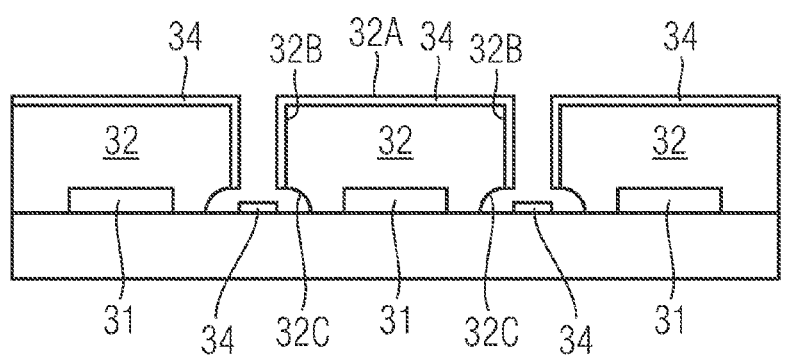
Figure 6H:
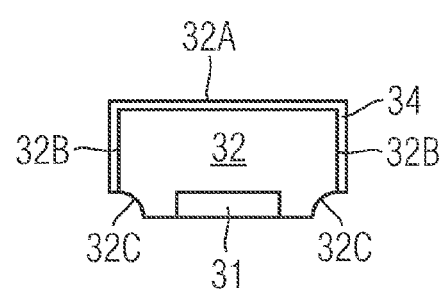

FIG. 6G shows the semiconductor chips 32 after depositing a metal layer 34 onto the back surfaces 32A and the side surfaces 32B of the semiconductor chips 32 and FIG. 6H finally shows a single semiconductor chip released from the carrier 35. With respect to the details of the method steps shown in FIGS. 6G and 6H, reference can be made herewith to the previous embodiment shown in FIGS. 5G and 5H.

Figure 7A:
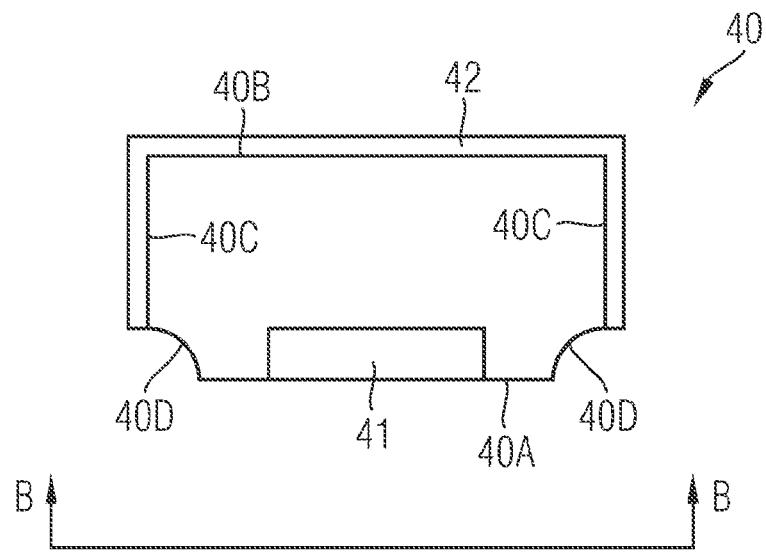
FIGS. 7A-7B show schematic cross-sectional side view representation (A) and a top view representation (B) of a semiconductor chip according to an embodiment.
Figure 7B:
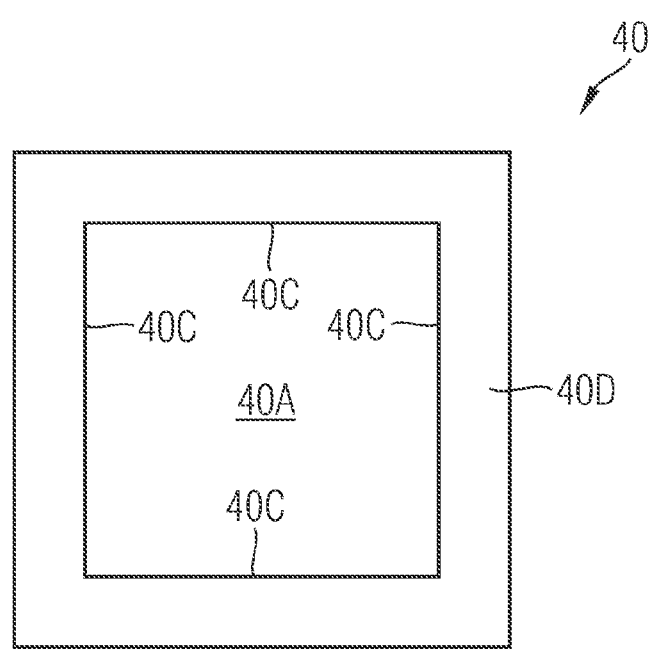

Referring to FIGS. 7A-7B there is shown a schematic cross-sectional side view representation (FIG. 7A) and a top view representation (FIG. 7B) of a semiconductor chip according to an embodiment. The semiconductor chip 40 comprises a semiconductor die 41, a first main face 40A and a second main face 40B opposite to the first main face 40A and a plurality of side faces 40C, and an indentation 40D at a transition between the first main face 40A and the side faces 40C.

According to an embodiment of the semiconductor chip of FIG. 7, an electrically conductive layer 42 is deposited onto the second main face 40B and the side faces 40C.

According to an embodiment of the semiconductor chip of FIG. 7, the indentation 40D is provided in the form of a ring-like circumferential indentation.

According to an embodiment of the semiconductor chip of the FIG. 7, the indentation 40D comprises a curved chip surface.

According to an embodiment of the semiconductor chip of FIG. 7, the indentation 40D is formed concave.

According to an embodiment of the semiconductor chip of FIG. 7, the indentation comprises a depth in the lateral direction of at least i/AR wherein i is the vertical extension of the indentation and AR is the aspect ratio of the groove.

According to an embodiment of the semiconductor chip of FIG. 7, an electrically conductive layer 41 is deposited onto the second main face 40B and the side faces 40C.

According to an embodiment of the semiconductor chip of FIG. 7, the semiconductor chip 40 comprises a transistor device, in particular a vertically structured transistor device.

According to an embodiment of the semiconductor chip of FIG. 7, the electrically conductive layer 42 is connected with an electrical device contained in the semiconductor chip 40.

According to an embodiment of the semiconductor chip of FIG. 7, at least one electrical contact pad is arranged on the first main face 40A.

What is claimed is:

1. A method for fabricating a semiconductor chip, the method comprising:
   structuring a semiconductor substrate to produce a plurality of semiconductor chips so that each semiconductor chip comprises a first main face and a plurality of side faces; and
   forming an indentation at a transition between the first main face and the side faces of each semiconductor chip; and
   grinding the plurality of semiconductor chips after structuring the semiconductor substrate.

2. The method according to claim 1, wherein forming the indentation comprises performing an etching step.

3. The method according to claim 2, wherein the etching step comprises an isotropic etching step.

4. The method according to claim 1, wherein structuring the semiconductor substrate comprises performing an etching step.

5. The method according to claim 4, wherein the etching step comprises an anisotropic etching step.

6. The method according to claim 1, wherein structuring the semiconductor substrate occurs before forming the indentation.

7. The method according to claim 1, wherein structuring the semiconductor substrate occurs after forming the indentation.

8. The method according to claim 1, wherein each of the semiconductor chips comprises a second main face opposite to the first main face, the method further comprising depositing a metal layer onto the second main face.

9. The method according to claim 1, further comprising grinding the semiconductor substrate.

10. A method for fabricating a semiconductor chip, the method comprising:

structuring a semiconductor substrate to produce a plurality of semiconductor chips so that each semiconductor chip comprises a first main face and a plurality of side faces; and forming a curved chip surface connected between the first main face and the side faces of each semiconductor chip after structuring the semiconductor substrate, wherein forming the curved chip surface comprises forming an indentation at a transition between the first main face and the side faces.

11. The method according to claim 10, wherein forming the curved chip surface comprises performing an etching step.

12. The method according to claim 11, wherein the etching step comprises an isotropic etching step.

13. The method according to claim 10, wherein structuring the semiconductor substrate comprises performing an etching step.

14. The method according to claim 13, wherein the etching step comprises an anisotropic etching step.

15. The method according to claim 10, wherein each of the semiconductor chips comprises a second main face opposite to the first main face, the method further comprising depositing a metal layer onto the second main face.

16. The method according to claim 10, further comprising grinding the semiconductor substrate.

17. The method according to claim 10, further comprising grinding the semiconductor chips after structuring the semiconductor substrate.

18. A semiconductor chip, comprising:
a first main face;
a second main face opposite the first main face;
a plurality of side faces;
an indentation at a transition between the first main face and the side faces; and
a metal layer disposed over the second main face and on the plurality of side faces.

19. The semiconductor chip according to claim 18, wherein the indentation comprises a circumferential indentation.

20. The semiconductor chip according to claim 18, wherein the metal layer is not disposed on a surface of the indentation.

21. The semiconductor chip according to claim 18, wherein the indentation comprises a depth of at least $i/AR$, wherein i is a vertical extension of the indentation and AR is an aspect ratio.

22. A semiconductor chip, comprising:
a first main face;
a second main face opposite to the first main face;
a plurality of side faces;
a curved chip surface located between the first main face and the side faces of the semiconductor chip; and
a metal layer disposed over the second main face and on the plurality of side faces.

23. The semiconductor chip according to claim 22, wherein the curved chip surface is part of an indentation at a transition between the first main face and the side faces.

24. The semiconductor chip according to claim 23, wherein the indentation comprises a depth of at least $i/AR$, wherein i is a vertical extension of the indentation and AR is an aspect ratio.

25. The semiconductor chip according to claim 11, wherein the metal layer is not disposed on the curved chip surface.

26. A method for fabricating a semiconductor chip, the method comprising:
structuring a semiconductor substrate to produce a plurality of semiconductor mesas so that each semiconductor mesa comprises a first main face and a plurality of side faces;
forming a curved chip surface connected between the first main face and the side faces of the semiconductor mesas; and
forming a plurality of semiconductor chips by grinding the semiconductor substrate after structuring the semiconductor substrate.

27. A method for fabricating a semiconductor chip, the method comprising:
structuring a semiconductor substrate to produce a plurality of semiconductor chips, wherein each semiconductor chip comprises a first main face and a plurality of side faces;
forming a curved chip surface connected between the first main face and the side faces of each semiconductor chip after structuring the semiconductor substrate; and
depositing a metal layer onto the plurality of side faces.

* * * * *

UNITED STATES PATENT AND TRADEMARK OFFICE
CERTIFICATE OF CORRECTION

PATENT NO. : 8,637,967 B2
APPLICATION NO. : 12/946138
DATED : January 28, 2014
INVENTOR(S) : Markus Menath Page 1 of 1

It is certified that error appears in the above-identified patent and that said Letters Patent is hereby corrected as shown below:

In the Claims

In Col. 10, line 19, claim 25, delete "claim 11" and insert --claim 22--.

Signed and Sealed this
First Day of July, 2014

Michelle K. Lee
*Deputy Director of the United States Patent and Trademark Office*